United States Patent [19]
Dunnam

[11] 3,968,449
[45] July 6, 1976

[54] RATE COMPENSATING MONOSTABLE MULTIVIBRATOR

[75] Inventor: Curtis R. Dunnam, Ithaca, N.Y.
[73] Assignee: NCR Corporation, Dayton, Ohio
[22] Filed: Dec. 16, 1974
[21] Appl. No.: 533,033

[52] U.S. Cl. .............................. 328/207; 307/273
[51] Int. Cl.² ................................... H03K 3/10
[58] Field of Search ............ 307/265, 273; 328/207

[56] References Cited
UNITED STATES PATENTS

| | | | |
|---|---|---|---|
| 3,204,124 | 8/1965 | Durio, Jr. | 307/265 |
| 3,304,437 | 2/1967 | Dano | 307/265 |
| 3,368,152 | 2/1968 | Jorgensen | 328/61 |
| 3,517,220 | 6/1970 | Gibson et al. | 307/273 |
| 3,539,934 | 11/1970 | Rudolph | 307/273 |
| 3,646,370 | 2/1972 | Lowe | 307/273 |
| 3,790,821 | 2/1974 | Adamson | 307/273 |

OTHER PUBLICATIONS
"Pulse Train Frequency Varied as Duty Cycle Stays Constant" by Ross, Electronics, July 21, 1969, p. 84.
"Duty Cycle is Constant at Any Trigger Frequency" by Klein Electronics, July 26, 1965, pp. 62–63.

*Primary Examiner*—Stanley D. Miller, Jr.
*Attorney, Agent, or Firm*—J. T. Cavender; Wilbert Hawk, Jr.; Jeffrey P. Morris

[57] ABSTRACT

A self-compensating time variable monostable multivibrator for use in applications such as thermal printing which require a rate dependent timing function, is disclosed in which a variable output pulse width is produced in response to a varying input trigger pulse repetition rate and in response to a control voltage developed by using the multivibrator output pulses to supply a time constant circuit which linearly modifies the control voltage in response to the output pulse widths. In another aspect of the disclosure, compensation is achieved by comparison of time dependent voltages developed by two time constant networks of unequal time constant in which the multivibrator circuit develops a variable width output pulse dependent upon both the input trigger pulse repetition rate and a control voltage derived from the two time constant networks.

11 Claims, 6 Drawing Figures

RATE COMPENSATING MONOSTABLE MULTIVIBRATOR

BACKGROUND OF THE INVENTION

1. Field of the Invention

The present invention relates to monostable or "one shot" multivibrators and is particularly directed to monostable multivibrators capable of generating output pulses of varying pulse widths in response to variation in the pulse repetition rate of the input triggering pulses.

It is desirable in a number of applications in computer technology and particularly in high speed thermal printing to accurately generate pulse trains of varying pulse widths consistently in response to rapidly changing input conditions. In thermal printing, a matrix of heating elements are energized in response to a plurality of electrical signals to insure that the printing faces of the heating elements are energized and de-energized in the proper sequence and for the correct time durations. A typical thermal printer of the "on-the-fly" type is described by U.S. Pat. No. 3,777,116 in which the thermally sensitive paper is continuously moved during the printing operation.

The use of a monostable multivibrator to provide variable pulse width signals as the time controlled printing head drive in a thermal printer necessitates rate compensation of the multivibrator to control its switching time, which is determinative of the ON and OFF time of the individual printing matrix elements, as the ON time of such elements must be decreased as the printing rate increases, thereby reducing the energy input per print cycle, and vice versa. It is important that the relationship between multivibrator output pulse width (the ON time of the multivibrator) and the trigger pulse repetition rate is predictable and consistent so that compensation for heating of the matrix elements and proper adjustment for varying printing rates is achieved.

2. Description of the Prior Art

The operation and construction of monostable multivibrators having a variable output pulse width and various compensation techniques for achieving such a variable pulse width are well known in the prior art. The instant invention comprises a new and improved circuit for achieving predictable and useful self-compensation without the attendant disadvantage of the prior art.

Monostable multivibrators generate an output pulse having a predetermined width in response to an input triggering pulse, with the output pulse width being independent of the input pulse width, but dependent upon the multivibrator circuit constants, usually determined by one or more RC networks. One such multivibrator of the prior art is disclosed by U.S. Pat. No. 3,530,314.

The prior art also discloses one shot multivibrators whose output pulse width is controlled in dependence upon the repetition rate of an input triggering pulse either by variation of the resistance value of the associated RC time constant components of the circuit or by variation of the effective capacitance value of the RC time constant components of the circuit, both of which techniques involve varying the circuit time constant by changing component values. The former technique is disclosed by U.S. Pat. No. 3,304,437 and the latter technique by U.S. Pat. No. 3,517,220. In U.S. Pat. No. 3,517,220, the switching transistors of the multivibrator are coupled through a variable capacitance feedback circuit in which a diode-capacitance timing network within the feedback circuit is responsive to a control voltage which controls the amount of capacitance in the feedback circuit. The value of control voltage determines the diode conductivity which in turn determines the amount of capacitance switched into or out of the circuit. This technique, and the other techniques of the known prior art have the disadvantage of requiring component variation or coupling and de-coupling of components to effect a time constant variation, which variation in turn is used to modify the multivibrator control voltage which determines the output pulse width. Additionally, the techniques of the known prior art do not provide either as linear a relationship between the output pulse width and multivibrator control voltage or as useful an operating range of trigger pulse frequencies over which consistant operation will occur.

SUMMARY OF THE INVENTION

The present invention relates to a self-compensating voltage controlled variable pulse width monostable multivibrator in which the combination of input trigger pulse repetition rate and a control voltage derived from a compensation network is used to vary the pulse width consistently over a useful range of triggering frequencies with less circuit complexity than circuits of the known prior art. The circuit time constant network components need not be varied to accomplish the above result and additional components such as additional resistance or capacitance need not be switched into or out of the time constant circuitry to derive the control voltage.

In a first embodiment of the invention, a voltage control signal for the monostable multivibrator is derived as a time averaged signal across a time constant network from the multivibrator output such that the control voltage varies linearly with the monostable output pulse width while the monostable output pulse width varies logarithmically with the input trigger pulse repetition rate.

In a second embodiment of the invention, variation of the output pulse width is accomplished by comparison of time dependent voltages derived by two RC networks of unequal time constant to derive a resultant control voltage such that the output pulse width is a function of both the trigger pulse repetition rate and the period of the network interim timing cycle, with the longer time constant of the two time constant networks being determinative of the range over which compensation will occur and the shorter time constant of the two time constant networks being determinative of the mean output pusle width. The resultant voltage is a substantially linear function of the output pulse width which is a substantially logarithmic function of the input trigger pulse repetition rate.

The foregoing and other features and advantages of the invention will be apparent from the following detailed description of the preferred embodiments of the invention together with the accompanying drawings.

DESCRIPTION OF THE PREFERRED EMBODIMENTS

Figure 1:
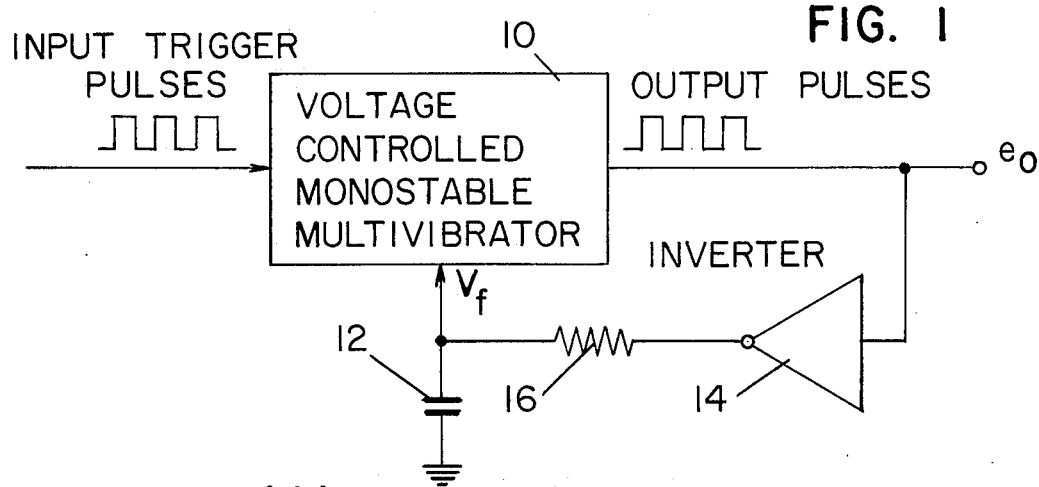
FIG. 1 is a simplified schematic diagram of a self-compensating time-variable variable pulse width monostable multivibrator in accordance with the present invention.

Referring to FIG. 1, a simplified circuit illustrative of a self-compensating time-variable voltage controlled monostable multivibrator in accordance with the present invention is shown. The voltage controlled monostable, or "one shot" multivibrator 10, which may be of known design such as that disclosed by U.S. Pat. No. 3,530,314 provides an output pulse in response to an input trigger signal of a time duration, or pulse width, dependent upon the various multivibrator time constants and input triggering signals thereto. The operation of the circuit of FIG. 1 will be better understood with reference to the timing diagrams of FIGS. 2(a), 2(b) and 2(c).

The application of a trigger pulse to multivibrator 10 causes the generation of an output pulse having a pulse width which is a substantially linear function of the voltage controlled multivibrator control voltage $V_f$ as will be explained. Control voltage $V_f$ is developed across capacitor 12 and represents a time averaged signal derived from the multivibrator output pulses which are coupled to capacitor 12 via inverter 14 and resistor 16. Since the multivibrator supply voltage is normally positive, inverter 14 serves to reference the control voltage $V_f$ to the supply voltage. An output pulse causes the inverter output to fall to zero, at which time the capacitor 12 discharges through resistor 16 with a time constant RC. The timing period of multivibrator 10 is linearly related to $V_f$ since capacitor 12 time averages the pulses coupled thereto, hence after a period of time voltage $V_f$ will reach a control level corresponding to the elapsed ON time of the multivibrator, i.e., the greater the output pulse width, the greater $V_f$ will be.

Figure 2A:
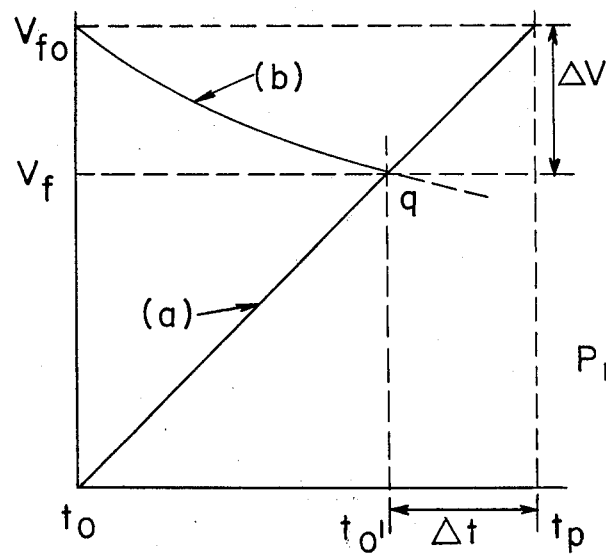
FIGS. 2(a) through 2(c) are timing and waveform diagrams illustrative of the operational characteristics of the multivibrator described with reference to FIG. 1.
Figure 2C:
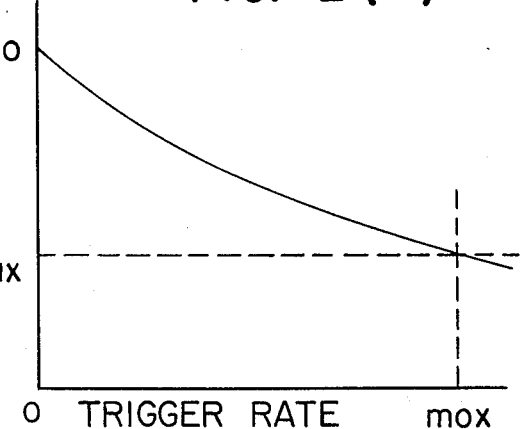
Figure 2B:
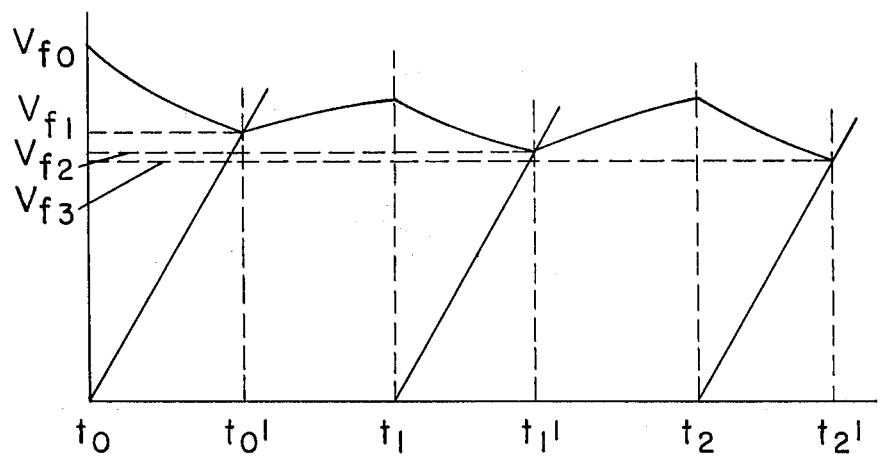

The reference voltage versus time curves of FIGS. 2(a) and 2(b) illustrate the variation of the reference voltage $V_f$ with time during operation of the multivibrator. As can be seen from FIG. 2(a), $V_f$ is linearly related to time by:

$$V_f = k_1 t$$

illustrated by curve (a) where time represents the one-shot cycle time of multivibrator 10 and $k_1$ is an internal circuit time constant. When capacitor 12 discharges through resistor 16, $V_f$ decreases exponentially during each individual one-shot timing period as shown by curve (b) and by the relationship:

$$V_f = (V_{f0} - V_{f1})e^{-k_2 t}$$

where $k_2 = 1/RC$, the internal circuit time constant, and $V_{f1}$ is the steady state control voltage.

At the intersection point of curves $a$ and $b$ shown as $(q)$, the capacitor is discharged to time $(t_0')$ such that the original reference voltage $V_{f0}$ has decreased by $\Delta V_f$ to $V_f'$, which results in a net timing change of $\Delta t$ which corresponds to the new reference voltage $V_f$. As a result, both the reference voltage and the charging time to reach the new reference voltage are changed.

When the reference voltage is lowered to its new level after the discharge or "timing out" of the multivibrator, the output voltage $e_0$ falls causing the inverter 14 output to begin to charge capacitor 12. This occurs at point $(q)$, the voltage controlled one shot time-out intercept, on the curve shown by FIG. 2(a), when the charge lost during the discharge cycle is equal to the charge gained since the previous trigger pulse. It is thus apparent that equilibrium level reference voltage $V_f$ is related to both the output pulse width which is the effective multivibrator ON time and the pulse repetition rate of the trigger pulses, hence steady state pulse width is logarithmically related to the trigger rate. Compensation of the output pulse width corresponds not only to the internal timing constants of the circuit, but also to the trigger frequency. At time $t_p$, which is dependent upon the trigger frequency, the aforementioned discharge cycle is again initiated.

FIG. 2(b) is illustrative of the multivibrator response during transition from an initial quiescent condition at time $t_0$ to a condition of constant rate operation. Following an initial trigger pulse at time $t_0$, reference voltage $V_{f0}$ is lowered to a new reference control voltage $V_{f1}$ at time $t_0'$ as described with reference to FIG. 2(a). At time $t_0'$, equilibrium between charge lost during discharge and charge reached from the trigger pulse at $t_0$ is reached, and capacitor 12 regains a portion of its lost charge during the time interval from $t_0'$ to $t_1$. At time $t_1$ a second trigger pulse is applied to capacitor 12 to again initiate the discharge cycle. As can be observed, the voltage level at time $t_1$ is somewhat less than the original $V_{f0}$, as it corresponds to $V_{f1}$ plus the charge accumulated during the time period $t_0'$ to $t_1$. When quiescence is again reached at time $t_1'$, reaching begins anew, except the new reference voltage $V_{f2}$ is less than $V_{f1}$ and capacitor 12 does not recharge at $t_2$ to as high a voltage level as it did at time $t_1$ because of the lower initial reference voltage level $V_{f2}$. When the next trigger pulse arrives at time $t_2$, the discharge cycle from $t_2$ to $t_2'$ is to a slightly lower voltage, $V_{f3}$ than the previous voltage $V_{f2}$ at time $t_1'$. After a number of cycles of charging and discharging, it can be seen that the reference voltage $V_f$ tends to stabilize at a substantially constant value and at such time the timing period is short enough for capacitor 12 to regain the exact amount of charge lost during each cycle. The steady state pulse width is thus logarithmically related to the trigger rate as a function of $$e^{-k_2 t}$$

and changes in trigger rate establish the new pulse width. Reference to FIG. 2(c) illustrates the steady state pulse width versus trigger rate, with $P_0$ being pulse width at a zero trigger rate and $P_{max}$ being pulse width at the maximum trigger rate, which typically is about 60 Hertz.

Figure 3:
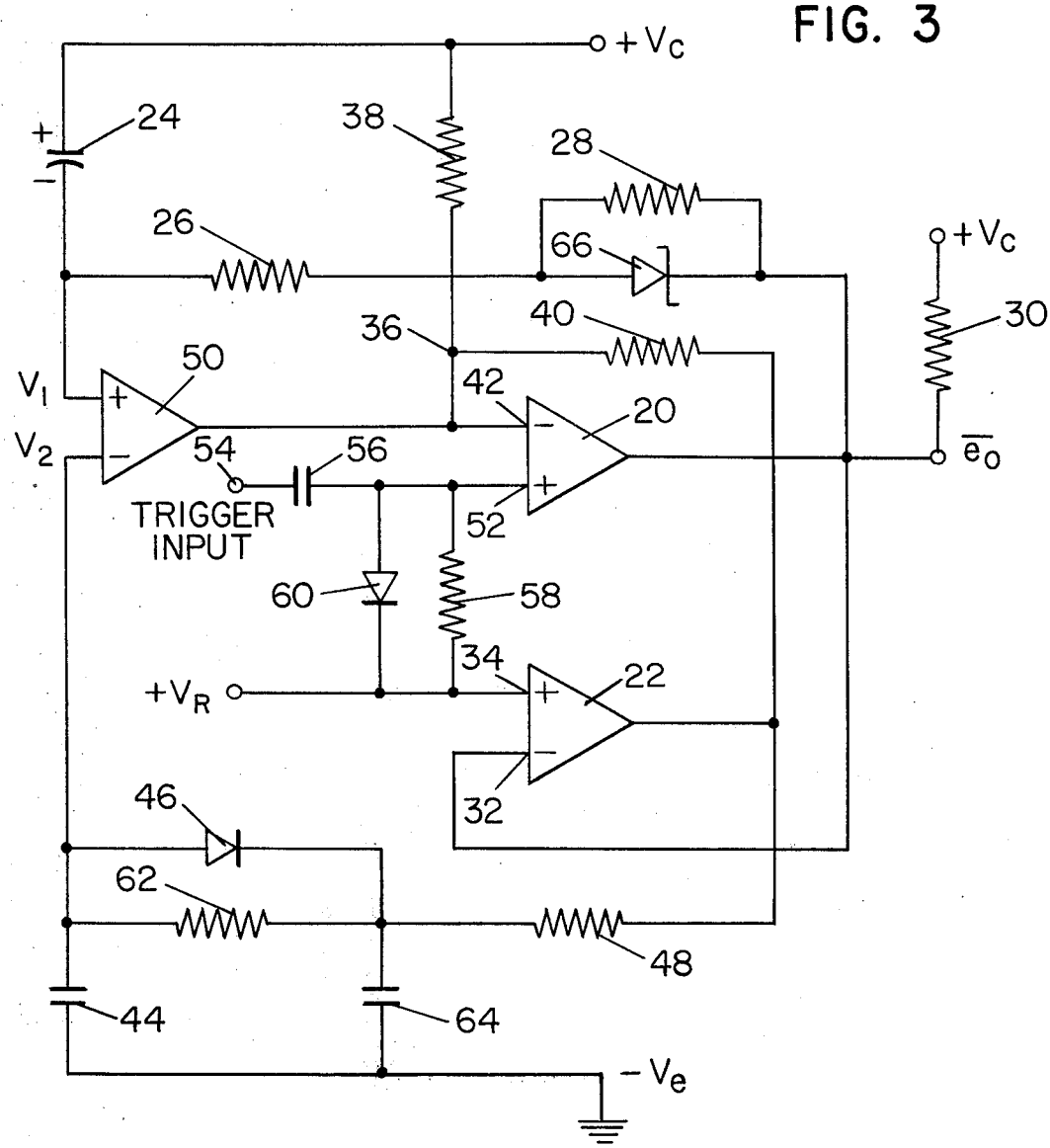
FIG. 3 is a circuit diagram of a variable pulse with self-compensating monostable multivibrator in accordance with the present invention.

Referring now to FIG. 3, a circuit implementation of the compensation technique heretofore described is shown in which the compensation is realized by the comparison of two time dependent voltages derived from two RC networks having unequal time constants. While the comparators shown are of the differential amplifier type, other comparators may be utilized. The circuit of FIG. 3 is utilized to generate an output pulse of variable width dependent upon both the trigger rate and the composite effect of the two RC networks to precisely set the multivibrator control voltage in correspondence with the interim timing cycle of the circuit.

Figure 4:
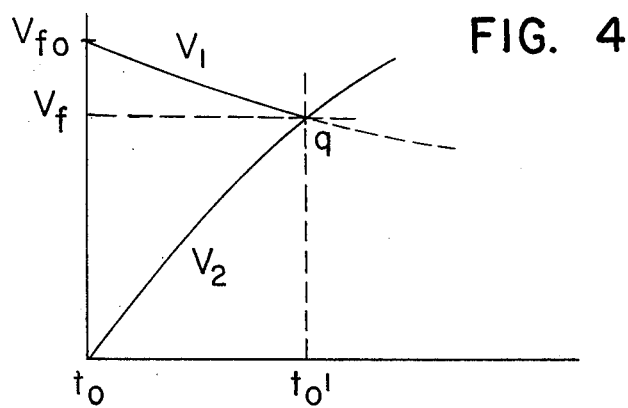
FIG. 4 is a timing and waveform diagram illustrative of the operational characteristics of the multivibrator described with reference to FIG. 3.

Operationally, the multivibrator of FIG. 3 is similar to that of FIG. 1 in that the control voltage is stabilized after a number of cycles of operation; however, the control voltage $V_f$ is no longer linearly related to time as in FIG. 2($a$), but rather is an exponential function of time as can be observed from FIG. 4; however, the exponential curve still approximates a linear relationship and can be said to be substantially linear.

A bistable latch comprised of voltage comparators 20 and 22 provides complimentary outputs used to provide the timing in the monostable multivibrator circuit. Comparators 20 and 22 may preferably comprise open collector comparators or quadrature devices, manufactured by Motorola, Inc. part number MC 3302. Prior to the application of a trigger input, the circuit is in the quiescent state with capacitor 24 charged to $+V_c$ (preferably 24 volts dc) through resistors 26 and 28, comparator 20 is OFF and comparator 22 is ON, creating a reference voltage level of $V_R/2$, where $V_R$ is a positive reference voltage, preferably 5 volts dc applied to the non-inverting input 34 of comparator 22, which insures that in quiescence, comparator 20 will be non-conductive so that the circuit load, illustratively shown as load resistor 30 between $V_c$ and comparator 20, will determine the output voltage $\overline{e_0}$, which is inverted. Inverted output $\overline{e_0}$ is high during quiescence, and maintains the inverting input 32 of comparator 22 at a more positive potential than the positive or noninverting input 34, which causes the output transistor (not shown) contained within comparator 22 to remain in saturation, which in turn causes a voltage of $V_R/2$ at the junction 36 of divider resistors 38 and 40, which voltage appears at the negative or inverting input 42 of comparator 20. Capacitor 44 is held at a low voltage level through diode 46 and resistor 48 which inhibits the output of comparator 50. Comparator 50 compares the voltages derived from the time constant circuits including capacitors 24 and 44 and preferably comprises a quadrature device operated in the open collector mode, also manufactured by Motorola, Inc., part number MC 3302.

When a negative trigger pulse is applied at the input 54, a transient pulse of the same magnitude is coupled to the non-inverting input 52 of comparator 20 after differentiation by a differentiation network comprised of capacitor 56, resistor 58 and diode 60. After a slight delay provided by the reference level $V_R/2$ and determined by the circuit time constants, the applied pulse reaches the reference level $V_R12$, causing comparator 20 to become conductive and switch ON thereby causing output voltage $e_0$ to fall. The resultant voltage decrease at the negative input 32 of comparator 22 causes comparator 22 to cease conducting and turn OFF, thereby raising the voltage appearing at the junction of resistors 38 and 40 to a level greater than the reference voltage $V_R$, insuring a latching of the two comparators 20 and 22 into the new stable state. Simultaneously with the switching of comparators 20 and 22, capacitor 24 begins to discharge with a time constant $k_2$ and capacitor 44 begins charging with a time constant $k_1$. Time constant $k_1$ is chosen such that it is shorter than the minimum trigger pulse repetition period and is determined by resistor 62, resistor 48, capacitor 44 and capacitor 64 and equals the product $(R_1 + R_2)(C_1 + C_2)$ where $R_1$ is resistor 62, $R_2$ is resistor 48, $C_1$ is capacitor 44 and $C_2$ is capacitor 64. The time constant $k_1$ is primarily determined by capacitor 44, as capacitor 64 is used to introduce a slight additional delay during charging of capacitor 44 to enhance noise immunity. Resistor 62 might alternately be a potentiometer to provide specific time constants if desired for particular applications. Time constant $k_2$ is chosen such that it is long with respect to the trigger pulse repetition rate and is determined by resistor 26, resistor 28, capacitor 24 and zener diode 66 and approximately equals the product $(R_1 + R_2)C_3$ where $R_1$ is resistor 26, $R_2$ is resistor 28 and $C_3$ is capacitor 24. The zener diode 66 enhances compensation recovery after fast triggering. The circuit time constants $K_2$ and $K_1$ determine the circuit compensation range and the mean output pulse width respectively.

When the rising voltage $V_2$ across charging capacitor 44 and the declining voltage $V_1$ across discharging capacitor 24 equalize as shown at point ($q$) of FIG. 4, comparator 50 becomes conducting and turns ON, thereby resetting the latch comprised of comparators 20 and 22, with the inverted output voltage $\overline{e_0}$ rising high enough due to the applied voltage $V_c$ to cause capacitor 24 to charge toward $V_c$ as previously described. Similarly, capacitor 44 discharges toward ground potential $(-V_e)$ through diode 46 and resistor 48 when comparator 50 become nonconducting.

The exponential time constants produced by the above-described circuit, because of their near linearity, permit accurate modification of the pulse width by varying the trigger rate over a consistent operating range of the multivibrator, with the resultant control voltage $V_f$ shown in FIG. 4 being substantially a linear function of the voltages $V_1$ and $V_2$ applied to the inputs of comparator 50.

While the invention has been shown and described with reference to the preferred embodiments thereof, it will be understood that persons skilled in the art may make modifications thereof without departing from the spirit and scope of the invention as defined by the claims appended hereto.

What is claimed is:

1. A self-compensating, time variable monostable multivibrator circuit comprising:
    bistable switching means having an even number of inputs for receiving input trigger pulses on one of said inputs and two outputs, one of which outputs is coupled to a load;
    a pair of time constant networks having unequal time constants to which the other of said outputs of the bistable switching means is coupled for generating a pair of control voltage signals;
    comparator means for comparing said pair of control voltage signals and for generating a comparison voltage; and
    means for coupling said comparison voltage to another of said inputs of said bistable switching means for providing self-compensation of said multivibrator.

2. A multivibrator in accordance with claim 1 wherein said bistable switching means comprises a bistable latch capable of assuming either of two stable states in response to said input trigger pulses, the time duration of which stable states is logarithmically related to said trigger pulse repetition rate.

3. A multivibrator in accordance with claim 2 wherein said bistable latch comprises first and second switching elements, said first switching element being conductive when said second switching element is non-conductive and said second switching element being conductive when said first switching element is non-conductive.

4. A multivibrator in accordance with claim 3 wherein the time duration of the stable states of the bistable switching means is approximately linearly related to the output comparison voltage of said comparator means.

5. A multivibrator in accordance with claim 4 wherein said time constant networks are RC networks having first and second time constants, said first time constant being of greater time duration than said second time constant and of greater duration than the period of said input trigger pulses.

6. A voltage controlled variable pulse width monostable multivibrator comprising:
bistable latching means including a pair of switching elements, each of said switching elements having at least two inputs and one output,
means for coupling a pulsed input signal to one input of one of said switching elements;
comparator means for deriving a control voltage and for coupling said control voltage to the other input of the switching element to which said pulsed input signal is coupled and for controlling the switching of said latching means, said comparator means having at least two inputs and one output;
a first time constant network having a first time constant coupled between the output of one of said switching elements and one of the inputs of said comparator for deriving a first voltage control signal having a substantially linear variation with respect to the pulse width of the output of said latching means;
a second time constant network having a second time constant coupled between the output of the other of said switching elements and the other of the inputs of said comparator for deriving a second voltage control signal having a substantially linear variation with respect to the pulse width of the output of said latching means;
a feedback network for coupling the output of one of said switching elements of said latching means to said first and second time constant networks;
means for coupling the output of said switching element of said latching means to which said control voltage is coupled to a load and to one input of the other switching element; and
means for coupling a reference voltage to the other input of said other switching element.

7. A monostable multivibrator in accordance with claim 6 wherein said first time constant network comprises an RC circuit having a time constant which is of a longer time duration than the repetition period of said pulsed input signal and wherein said second time constant network comprises an RC circuit having a time constant which is of less time duration than the repetition period of said pulsed input signal.

8. A monostable multivibrator in accordance with claim 7 wherein said control voltage derived from the comparison of said first and second voltage control signals by said comparator means varies substantially linearly with the pulse width of the output of said latching means.

9. A monostable multivibrator in accordance with claim 8 wherein the pulse width of the output of said bistable latching means is logarithmically related to the pulse repetition rate of said pulsed input signal.

10. A monostable multivibrator in accordance with claim 7 wherein the pulse width of the output of said bistable latching means is logarithmically related to the pulse repetition rate of said pulsed input signal and said control voltage varies substantially linearly with the pulse width of the output of said latching means.

11. A monostable multivibrator in accordance with claim 10 wherein said switching elements comprise voltage comparators which assume either a conducting or non-conducting state in response to the voltages applied at the inputs thereto.

* * * * *